United States Patent [19]

Suzuki

[11] Patent Number: 4,944,645
[45] Date of Patent: Jul. 31, 1990

[54] METHOD AND APPARATUS FOR LOADING OBJECTS INTO EVACUATED TREATING CHAMBER

[75] Inventor: Akira Suzuki, Numazu, Japan

[73] Assignee: Toshiba Kikai Kabushiki Kaisha, Tokyo, Japan

[21] Appl. No.: 296,277

[22] Filed: Jan. 11, 1989

Related U.S. Application Data

[63] Continuation of Ser. No. 850,226, Apr. 10, 1986, abandoned.

[30] Foreign Application Priority Data

Apr. 16, 1985 [JP] Japan ................... 60-81080

[51] Int. Cl.⁵ .......................... H01L 21/30
[52] U.S. Cl. .................. 414/217; 414/331; 432/10; 432/223
[58] Field of Search ......... 414/217, 331, 417; 432/223, 225, 10; 374/180; 204/298

[56] References Cited

U.S. PATENT DOCUMENTS

| | | | |
|---|---|---|---|
| 3,407,097 | 10/1968 | Engelhard | 374/180 X |
| 3,521,765 | 7/1970 | Kasuffman et al. | 414/217 |
| 3,656,454 | 4/1972 | Schroder | 414/217 X |
| 3,756,067 | 9/1973 | Cushman | 374/180 X |
| 4,487,675 | 12/1984 | Meckel | 204/298 X |
| 4,498,833 | 2/1985 | Hertel | 414/217 |
| 4,506,455 | 3/1985 | Rossi | 414/331 X |
| 4,529,869 | 7/1985 | Ekstrom, Jr. | 374/180 X |
| 4,565,601 | 1/1986 | Kakehi et al. | 204/298 X |
| 4,664,578 | 5/1987 | Kakehi | 414/217 |

FOREIGN PATENT DOCUMENTS 53-54906 5/1978 Japan.
56-201023 6/1981 Japan.

OTHER PUBLICATIONS

IEEE Transactions on Electron Devices, vol. ED-16, No. 9, Sep. 1979, pp. 1299-1305, Yau, Leopoldo D., "Process-Induced Distortion in Silicon Wafers".

Primary Examiner—David A. Bucci
Attorney, Agent, or Firm—Koda & Androlia

[57] ABSTRACT

In a method and apparatus for depicting a circuit pattern on an article such as a semiconductor wafer, glass mask or a reticle supported by a stage in an evacuated casing with an electron beam, the article is disposed in a magazine contained in a sealable chamber communicated with the evacuated chamber. The article is contacted with a heat adjusting member to adjust the temperature thereof. After matching the level of the article with that of the stage, the article is loaded on the stage.

9 Claims, 3 Drawing Sheets

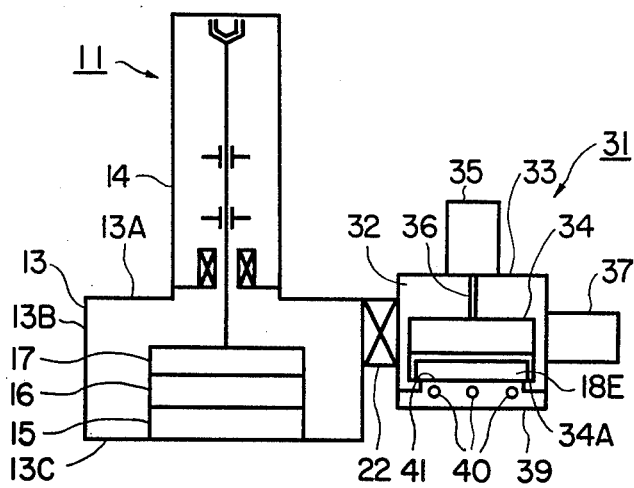
F I G. 1
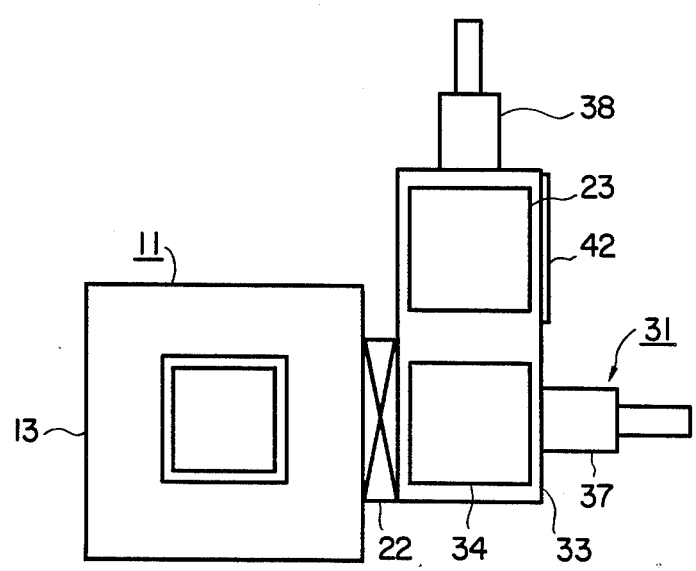
F I G. 2

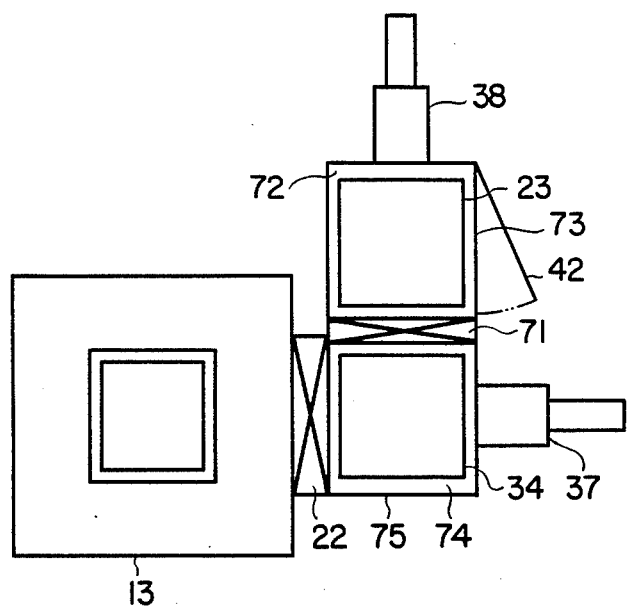
F I G. 5

METHOD AND APPARATUS FOR LOADING OBJECTS INTO EVACUATED TREATING CHAMBER

This is a continuation of application Ser. No. 850,226, filed Apr. 10, 1986, now abandoned.

BACKGROUND OF THE INVENTION

This invention relates to a method and apparatus for loading a holder for loading an article to be treated as a semiconductor substrate, for example a silicon wafer or a glass mask or a reticle, on a stage in an evacuated treating chamber or casing in which a circuit pattern is depicted on the wafer, the glass mask or the reticle with an electron beam or the dimension of the wafer, glass mask or a reticle is measured with an electron beam.

In a modern integrated circuit of extremely high density, for example, several tens of thousands or one million or more bits on one chip, the line width depicted is extremely narrow of the order of submicrons. Accordingly, it is a practice to depict a circuit pattern on a relatively large glass mask and then transfer printing the circuit pattern onto the surface of the wafer by reducing the size of the depicted circuit pattern. To simplify the description, in the following, a case wherein the circuit pattern is depicted directly on the surface of a semiconductor wafer will be described.

Taking apparatus for depicting a circuit pattern with an electron beam as an example, one example of a prior art loading apparatus will firstly be described with reference to FIG. 6. The apparatus shown therein comprises an electron beam circuit pattern depicting apparatus 11, a loading apparatus 12, and an electron beam column 14 mounted on a casing 13 constituting an evacuated treating chamber. Although many types of the electron beam irradiating device are known, one disclosed in the specification of Japanese Patent Publication No. 54906/1982 is considered suitable. A saddle 16 is mounted on a base 15 at the bottom of casing 13 to be movable toward left and right, and a stage 17 is mounted on saddle 16 to be movable in a direction perpendicular to the sheet of drawing. A holder 18B securely holding a semiconductor (for example silicon) wafer, not shown, is mounted on the stage 17. The direction of movement in the X and Y directions of rectangular coordinates and the position of holder 18B are controlled by moving saddle 16 and stage 17 with a suitable driving mechanism, not shown. The casing 13 is constituted by an upper plate 13A, side walls 13B and a bottom plate 13C which are formed with passages, not shown, for passing water at a constant temperature for maintaining various elements contained in the casing at a predetermined constant temperature. By ON•OFF controlling and deflecting electron beam 14a as in a raster scanning system or a vector scanning system, a circuit pattern can be depicted on the wafer mounted on the stage.

The loading apparatus 12 comprises a sealable casing 21 connected to casing 13 through a valve 22. A magazine 23 housed in casing 21 is connected to an elevating mechanism 24 via rod 25. In the magazine 23 are contained holders 18A, 18C and 18D in the order mentioned. Either one of these holders is loaded and unloaded onto and from stage 17 by a loader 26 at the same level as holder 18B in the casing 13. A second space from upper of magazine 23 is shown vacant since holder 18B which had occupied this space has been loaded in casing 13. When depiction of the circuit pattern on the substrate held by holder 18B is completed, it is transferred into magazine 23. Then the magazine 23 is elevated by one pitch by elevator mechanism 24, and the holder 18C is loaded.

In the loading apparatus of the type described above, to remove a holder carrying a wafer whose pattern writing has been completed and to load a new holder on the magazine 23, valve 22 is closed and then inert gas such as $N_2$ is admitted into casing 21 through a leak valve, not shown. A door, not shown, of the casing 21 is opened to exchange the already treated holder with a new holder. Then a vacuum pump, not shown, is operated to evacuate a space 21A in the casing 21. At this time magazine 23 and the newly loaded holder would be cooled due to adiabatic expansion of gas which has been filled in space 21A. For this reason, even when the temperature of a holder is made equal to that of stage 17 before loading the holder into magazine 23, the temperature of the holder becomes much lower than that of the stage 17. Accordingly, when such a cold holder is loaded on the stage 17, not only the temperature of the holder would vary on the stage thus making it difficult to ensure accurate positioning but also the temperature of the stage would be varied. Moreover, as magazine 23 is moved it is difficult to maintain it at a desired constant temperature by passing water at the constant temperature directly through the magazine. When a square holder made of aluminum having a side length of $l=170$ mm is subjected to a temperature variation of 0.5° C., the amount $\Delta l$ of its thermal deformation is expressed by the following equation:

$$\Delta l = l \times a \times 1 = 170 \times 23.5 \times 10^{-6} \times 0.5 = 0.002$$

where $\alpha$ represents the linear expansion coefficient of aluminum Thus, $\Delta l$ is equal to about 2 microns. Suppose now that the temperature of the holder has varied by 0.5° C. by the heat transmitted from the stage 17 while the holder loaded on stage 17 is being depicted with a circuit pattern. Then the dimension of one side of the holder varies by about two microns which presents a fatal problem.

SUMMARY OF THE INVENTION

Accordingly it is an object of this invention to provide an improved method and apparatus for loading an article to be treated or depicted with a circuit pattern capable of correcting temperature variation of a holder holding the article which occurs when a casing containing the holder is evacuated, thus preventing temperature variation at the time of loading the article into the casing so as to effect highly accurate pattern depiction or measurement of the dimension of the article.

Another object of this invention is to provide a novel method and apparatus capable of reducing the waiting time necessary to correct decrease in temperature of the article caused by adiabatic expansion of gas which occurs when evacuating a chamber containing the article, thereby preventing dimensional error.

Still another object of this invention is to provide a method and apparatus for treating an object in an evacuated casing and provided with a novel temperature adjusting member capable of quickly correcting temperature decrease of an object to be treated.

According to one aspect of this invention there is provided apparatus for loading an article to be treated into an evacuated treating casing comprising a sealable chamber communicated with the evacuated treating casing; a magazine disposed in the sealable chamber for supporting the article; temperature adjusting means disposed in the magazine in contact with the article; and means for loading the article whose temperature has been adjusted to a predetermined temperature by the temperature adjusting means into the treating casing.

According to another aspect of this invention, there is provided a method of loading an article to be treated on a stage in an evacuated casing, comprising the steps of preparing a sealable chamber containing a magazine and communicated with the evacuated casing, means for evacuating the sealable chamber, and temperature adjusting means contained in the magazine; evacuating the sealable chamber with the evacuating means; disposing the article in the magazine in contact with the temperature adjusting means for matching the temperature of the article with that of the stage; and loading the article on the stage in the evacuated casing.

BRIEF DESCRIPTION OF THE DRAWINGS

In the accompanying drawings:

FIG. 1 is a diagrammatic vertical sectional view showing one embodiment of the loading apparatus embodying the invention;

FIG. 2 is a diagrammatic plan view of the loading apparatus shown in FIG. 1;

FIG. 5 is a diagrammatic cross-sectional view showing another embodiment of this invention.

DESCRIPTION OF THE PREFERRED EMBODIMENTS

Figure 3:
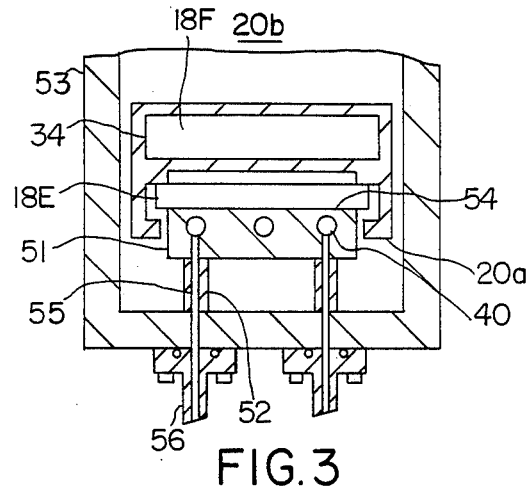
FIGS. 3, 3A and 4 are partial longitudinal sectional views showing other examples of the temperature adjusting means shown in FIG. 1.
Figure 3A:
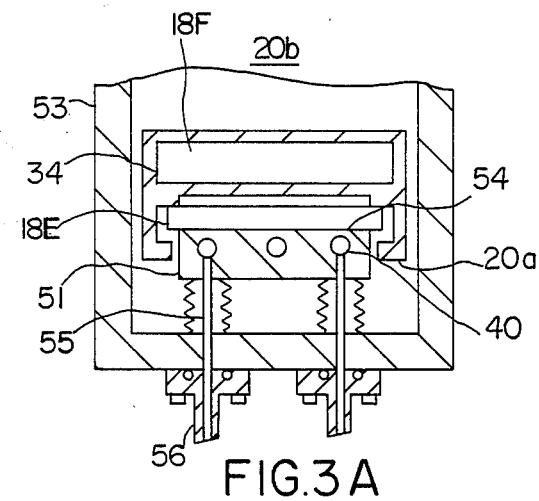

A preferred embodiment of this invention will now be described with reference to FIGS. 1 and 2. The electron beam depicting device 11 is identical to that shown in FIG. 6. A sealable casing 33 is connected to the casing 13 via valve 22, and a magazine 34 in the casing 33 is connected to an elevator mechanism 35 through a rod 36. The magazine 34 has a capacity of holding two holders (in FIG. 1 only the lower holder 18E is shown). When the magazine 34 is lowered, the upper holder supporting surface coincides with the upper surface of stage 17 in the casing 13, whereas when the magazine 34 is raised, the lower holder supporting surface comes to coincide with the upper surface of the stage, so that holder 18E can be loaded and unloaded on and from stage 17 by a loader 37 and elevator mechanism 35. Magazine 34 is not provided with a bottom plate, and the lower holder 18E is supported by a ledge 34A at the lower inner end of magazine 34.

Figure 6:
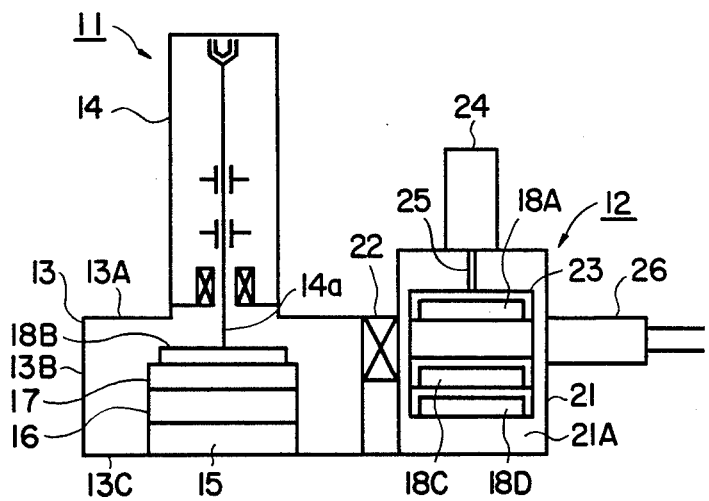
FIG. 6 is a diagrammatic longitudinal sectional view showing prior art loading apparatus.

As shown in FIG. 2, in chamber 33, a magazine 23 identical to that shown in FIG. 6 is positioned in parallel with magazine 34. Since there are two magazines 23 and 34, in addition to the elevator mechanism 35, an identical elevator mechanism, not shown, is provided. By using these elevator mechanisms, another holder, for example 18E, is mounted between magazines 23 and 34. A temperature adjusting member 39 closing the bottom of the casing 33 is provided with a fluid passage 40 through which fluid (air or water) controlled to have a constant temperature by heating or cooling is passed to maintain the upper surface 41 of the temperature adjusting member 39 at a predetermined temperature. The casing 33 is provided with a door 42 (see FIG. 2) for exchanging holders.

Various mechanisms for loading and unloading a wafer held by a holder into and out of a magazine have been proposed. According to the construction disclosed in Japanese Laid Open Patent Specification No. 201023/1982, a recess with one side open is formed on the upper surface of the holder and a plurality of reference plates engaging upper four sides of the holder are secured to a stage. After inserting the holder into the recess through a side opening, the holder is raised by spring means or the like to engage the upper surface of the wafer against the reference plates so as to firmly hold the upper surface at a correct level.

The embodiment described above operates as follows. Four holders 18A, 18C, 18D and 18E (these are shown in FIGS. 1 and 6) are transferred to the lower side of magazine 34, one after one, by a loader 38 and elevating mechanisms 24 and 35. The lowermost holder is then transferred onto stage 17 through valve 22 by loader 37. After depicted with a desired circuit pattern with the electron beam the holder is returned to the upper side of the magazine 34 and thence to magazine 23. Then the magazine 34 is raised by the elevating mechanism and the next new holder is transferred onto the stage 17 to be depicted with the circuit pattern on the wafer held by the new holder. When the depiction of the circuit pattern is completed the magazine 34 is lowered by the elevating mechanism. Since both casings 13 and 33 are evacuated to substantially equal pressure, valve 22 may be an air tight slide door. When all holders have been transferred into magazine 23, the holders therein are exchanged with new ones loaded with new wafers loaded in a manner described above. To this end, valve 22 is closed and inert gas is filled in casing 33 by opening a leak valve (not shown) to increase the gas pressure in chamber 32 to atmospheric pressure. Then door 42 is opened to exchange the holders in magazine 23 with new holders which have been preheated to a predetermined temperature. After closing the leak valve and door 42, one of the new holders 18E is transferred to the lower side of magazine 34 with loader 38 in contact with the temperature adjusting member 39. At this time, the holder 18E can be pressed against the temperature adjusting member 39 with a suitable pressure applying device, not shown. Then the space 32 in chamber 33 is evacuated by a suitable vacuum pump, not shown. Although the temperature of holder 18E decreases a little due to the adiabatic expansion as in the prior art described above, since the holder 18E is in contact with the temperature adjusting member 39 held at a predetermined temperature by the fluid flowing through passage 40, the holder recovers the predetermined temperature in a short time. Then the holder 18E is raised by the elevating mechanism 35 to the same level as the stage 17, and after opening valve 22 the holder 18E is transferred onto the stage 17 by loader 37 so as to depict the circuit pattern on a wafer held in holder 18E. During this time, the next holder (for example holder 18C shown in FIG. 6) is transferred from magazine 23 into a vacant space in magazine 34 which previously has been occupied by holder 18E so that the holder 18C is heated or cooled to a predetermined temperature by the temperature adjusting member 39 while the wafer in the holder 18E is being depicted with the circuit pattern. Then, the holder 18E is returned to the upper side of magazine 34 and returned to magazine 23. Thereafter holder 18C which has been heated or cooled to the predetermined temperature is loaded on stage 17. Remaining two holders are transferred in the same manner. For the sake of simplicity, the operation of the elevator mechanisms was not described, but it will be clear that they are operated in the same manner as above described for raising and lowering respective holders.

Furthermore, in the foregoing description, although transfer of holders from magazine 23 to magazine 34 is made before evacuation of chamber 33, such transfer may be made during the evacuation. Further, instead of depicting a circuit pattern on a wafer, it should be understood that the invention can be applied to apparatus for loading an article heated or cooled to a predetermined temperature into an evacuated treating chamber for measuring the dimension of the article with an electron beam. Instead of providing the temperature adjusting member 39 at the bottom of casing 33, the temperature adjusting member 39 can be disposed at any position of the casing, for example, at the upper portion thereof, in which case, the elevating mechanism is secured to the lower surface of the casing 33.

FIG. 3 shows another example of the temperature adjusting member. In this example, the temperature adjusting member 51 is spaced from the bottom of casing 53 by pedestals 52 including fluid passages 55. Consequently, the temperature adjusting member 51 is not connected to the casing 53 except the pedestals so that the member 51 is not influenced by external temperature and the temperature of the upper surface 54 is governed by the temperature of the fluid flowing through the passage 40. It is advantageous to make the pedestals 52 of insulating material. The passage 40 is connected to an external source of heating or cooling medium through passages 55 in the pedestals 52 and couplings 56. As shown by FIG. 34 the pedestals 52 can be substituted by metal bellows. The bellows are compressed when an excessive pressure is applied to the holder on the temperature adjusting member 51 so that the excessive pressure can be alleviated.

Figure 4:
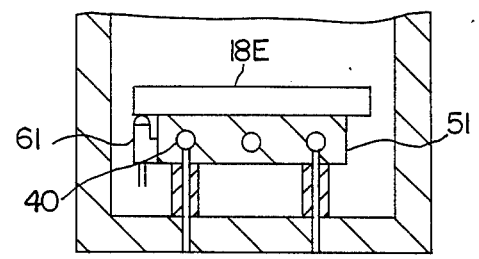

FIG. 4 also shows another example of the temperature adjusting member 51 which is identical to that shown in FIG. 3 except that a temperature measuring device 61, for example a thermocouple, is attached to one side of the temperature adjusting member 51 for measuring the temperature of the holder 18E. The output signal of the temperature measuring device 61 is used to load holder 18E on stage 17 when the temperature of the holder 18E reaches the predetermined temperature or to control the temperature of the fluid flowing through the passage 40. Alternatively, the temperature of the fluid can be controlled by other temperature measuring device than 61.

FIG. 5 shows another embodiment of this invention which is different from the first embodiment in that casing 33 shown in FIG. 1 is divided into, two casings 73 and 75 by a valve 71. Thus, the casing 73 defines a sealable chamber 72 alternately evacuated and filled with gas under atmospheric pressure and a sealable chamber 74 is normally maintained in an evacuated condition. At first, magazine 23 shown in FIG. 2 is placed in casing 73, and magazine 34 shown in FIG. 2 is placed in casing 75. Although in the first embodiment, at the time of exchanging the holders valve 22 is closed, in the modified embodiment, valve 71 is closed without closing valve 22. After exchanging the holders in magazine 23, first chamber 73 is evacuated while maintaining valve 71 in the closed state. After evacuation, valve 71 is opened for transferring holders between magazines 23 and 34 in the same manner as in the first embodiment. While in the first embodiment, the temperature adjusting member 39 is cooled at the time of evacuation, in the modified embodiment, since the temperature adjusting member is always maintained at a reduced pressure its temperature would not be influenced by external temperature condition.

As above described, according to this invention, the temperature of a holder supporting an article to be treated with an electric beam is maintained at a predetermined value or rapidly brought back to that value even when the temperature is decreased due to adiabatic expansion of gas in a casing occurring at the time of evacuating the casing. Accordingly, the article can be accurately treated without any dimensional error caused by temperature variation. Moreover, it is possible to greatly reduce the waiting time for the article to be treated to reach a predetermined temperature and to simplify the construction of the temperature adjusting member because it is fixed or constructed to be movable for a relatively small distance.

What is claimed is:

1. Apparatus for loading an article to be treated into an evacuated treating casing, said article being depicted with a circuit pattern in said treating casing with an electron beam at a predetermined temperature, comprising:

a sealable chamber communicating with said evacuated treating casing;

a magazine disposed in said sealable chamber for supporting said article which has been preadjusted to a temperature substantially equal to said predetermined temperature;

temperature adjusting means disposed in said sealable chamber such that said temperature adjusting means can contact directly with a surface of a holder supporting said article for adjusting temperature of said article to said predetermined temperature in order to compensate for a temperature variation of said article caused by adiabatic expansion of gas exhausted from said sealable chamber;

means for loading said article whose temperature has been adjusted to said a predetermined temperature by said temperature adjusting means into said treating casing; and a plurality of holders contained in said magazine, each holder supporting an article, and an elevator means for successively bringing one of said holders to a predetermined level.

2. The apparatus according to claim 1 wherein dimensions of said article are measured with an electron beam.

3. The apparatus according to claim 1 wherein said chamber is connected to another chamber having a door through vacuum tight valve means, so that said first chamber can be maintained in an evacuated state when said article is exchanged through said door.

4. The apparatus according to claim 1 which further comprises temperature measuring means for measuring a temperature of said article when the holder is in contact with said temperature adjusting means.

5. The apparatus according to claim 1 further comprising a heat insulating supporting member for supporting said temperature adjusting means in said chamber.

6. The apparatus according to claim 1 further comprising means for passing fluid heated or cooled at a constant temperature through said temperature adjusting means.

7. The apparatus according to claim 6 wherein said insulating supporting member is provided with an internal passage for passing fluid heated or cooled to a predetermined temperature through said temperature adjusting means.

8. The apparatus according to claim 1 further comprising means for resiliently supporting said heat adjusting means in said chamber.

9. The apparatus according to claim 8 wherein said resiliently supporting means comprises a bellows.

* * * * *